United States Patent [19]

Irinoda et al.

[11] Patent Number: 5,123,975
[45] Date of Patent: Jun. 23, 1992

[54] SINGLE CRYSTAL SILICON SUBSTRATE

[75] Inventors: Mitsugu Irinoda, Sendai; Koichi Haga, Shibata, both of Japan

[73] Assignees: Ricoh Company, Ltd., Tokyo; Ricoh Research Institute of General Electronics Co., Ltd., Natori, both of Japan

[21] Appl. No.: 493,335

[22] Filed: Mar. 14, 1990

[30] Foreign Application Priority Data

Mar. 28, 1989 [JP] Japan .................. 1-76238

[51] Int. Cl.⁵ .................. H01L 21/205; H01L 21/84
[52] U.S. Cl. .................. 148/33.2; 148/33.3; 156/603; 156/604; 437/46; 437/62; 437/83; 437/84; 437/174; 437/233; 437/973
[58] Field of Search .................. 437/83, 84, 62, 233, 437/174, 973, 46; 148/33.2, 33.3; 156/603, 604

[56] References Cited

U.S. PATENT DOCUMENTS

| | | | |
|---|---|---|---|
| 3,950,188 | 4/1976 | Bower | 437/46 |
| 4,662,059 | 5/1987 | Smeltzer | 437/84 |
| 4,743,567 | 5/1988 | Pandya | 437/84 |
| 4,752,590 | 6/1988 | Adams | 156/603 |

FOREIGN PATENT DOCUMENTS

| | | | |
|---|---|---|---|
| 0080160 | 7/1978 | Japan | 437/84 |
| 0044789 | 3/1980 | Japan | 437/84 |
| 0035412 | 4/1981 | Japan | 437/84 |
| 0053824 | 3/1983 | Japan | 437/83 |
| 0082744 | 5/1984 | Japan | 437/84 |
| 0075513 | 4/1986 | Japan | 437/83 |
| 0084014 | 4/1988 | Japan | 437/83 |

Primary Examiner—Robert Kunemund
Assistant Examiner—Ourmazd S. Ojan
Attorney, Agent, or Firm—Oblon, Spivak, McClelland, Maier & Neustadt

[57] ABSTRACT

A single crystal silicon substrate which comprises an electric insulation member and a single crystal silicon film formed on the insulation member. The silicon film has first regions and second regions. Each of the first regions is formed as a strip shape and has a high density of inorganic impurities implanted thereinto. Each of the second regions is formed as a strip shape and has a low density of the impurities. The first and second regions are alternatively arranged contacting with each other so that the first regions are separated from each other.

5 Claims, 5 Drawing Sheets

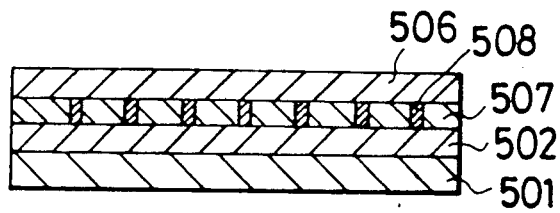
Fig. 7a
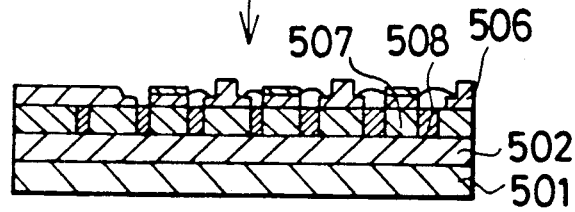
Fig. 7b
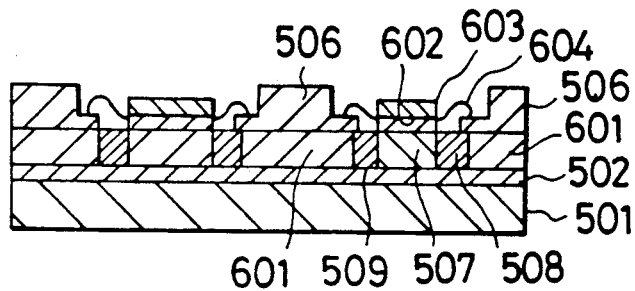
Fig. 7c
Fig. 8
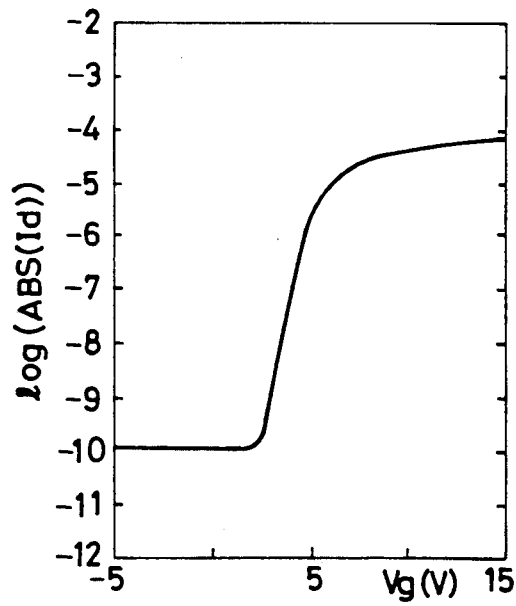

SINGLE CRYSTAL SILICON SUBSTRATE

BACKGROUND OF THE INVENTION

1. Field of the Invention

The present invention relates to a single crystal silicon substrate which contains inorganic impurity atoms and which substrate is used as a basic material for obtaining a silicon film by a hetero-epitaxial growth method, or manufacturing a high quality semiconductor device.

2. Description of the Related Art

A high quality semiconductor device comprises a single crystal silicon substrate made from an insulation material such as a glass plate on which a single crystal silicon film is formed. The substrate is produced by a zone melt recrystallization method.

However, the method involves a problem of grain boundary. To cope with the problem, a method has been adopted in which the grain boundary is generated only in a region where the material thereof does not influence the characteristic of the substrate so as to avoid the degradation of the device due to the grain boundary. More precisely, a film layer of $Si_3N_4$ is disposed in a form of strips on a surface of the substrate covered with a film of $SiO_2$. The $Si_3N_4$ film absorbs optical rays so that the region under the film is heated. As a result, recrystallization of the heated region is retarded so that grain boundaries of different crystal face are concentrated at the region. Therefore, by disposing the $Si_3N_4$ film at a desirable region, it becomes possible to generate the grain boundaries only in that region of the substrate.

However, in accordance with the grain boundary control method mentioned above, heat distribution is changed according to a slight difference of film quality and film thickness so that the refractive index of the substrate is changed due to a slight change of the film quality as well as the optical absorption coefficient thereof, which makes it difficult to obtain a substrate of stable and even characteristic distribution. Besides, cracks are generated due to the difference of film thickness and film quality in the substrate.

SUMMARY OF THE INVENTION

It is therefore an object of the present invention to provide a single crystal silicon substrate in which the problems of the related art mentioned above are obviated and the grain boundaries are easily concentrated in a desired strip region of the substrate without degradation of the characteristic of the substrate and generating cracks therein.

The object of the invention can be achieved by a single crystal silicon substrate comprising an electric insulation member and a single crystal silicon film formed on the insulation member, the film comprising a plurality of first strip regions having a high density of inorganic impurity atoms and a plurality of second strip regions having a low density of inorganic impurity atoms, the first and second regions being disposed alternately and in contact with each other so that the first regions are disconnected from each other.

The present invention utilizes a freezing point depression phenomenon of the silicon film due to the inorganic impurity atoms contained therein instead of forming a film of $Si_3N_4$ as an optical ray absorbent on the $SiO_2$ film on the surface of the substrate as is the case of the related art mentioned before. By implanting impurities to strip regions in a polycrystalline silicon or an amorphous silicon film, the freezing point of the strip regions is depressed at the time of recrystallization after being melted, which causes the retardation of recrystallization at the regions so that the grain boundaries are concentrated in the regions.

Also, it is possible to arrange a MOS transistor device using the substrate mentioned above in such a way that the source portion and the drain portion of the transistor are made from the region of high density of the impurities in which the grain boundaries are generated, while the active portion of the transistor is made from the region in which the grain boundaries are not generated. By such an arrangement, the characteristic of the transistor is upgraded and it becomes possible to shorten the time of diffusion process since the source and drain portions contain much impurities.

An advantage of the above-mentioned single crystal silicon substrate in accordance with the present invention is that, due to the arrangement wherein the high impurity density strip regions and the low impurity density strip regions are alternately disposed in contact with each other, the freezing point of the high density region is depressed at the time of recrystallization thereof so that the recrystallization of the regions is retarded compared with the regions of low impurity density, which concentrates the grain boundaries to generate in the high density regions and no grain boundaries are generated in the low density regions.

Another advantage of the substrate structure of the present invention is that, since the high density regions do not come in contact with each other, by using the atoms of one element of groups III to V in the periodic table as the impurity materials, it becomes possible to use the impurity containing region exclusively as the source or drain of the MOS transistor where the grain boundaries do not impair the characteristic of the transistor.

Still another advantage of the substrate structure of the present invention is that, by arranging such that the width of the strip region of high impurity density is narrower than that of the low density strip, the freezing point depression effect is enhanced at the time of recrystallization and it becomes possible to widen the effective area of the low impurity density region which is used as the active portion of the transistor.

Further objects and advantages of the present invention will be apparent from the following description of the preferred embodiments of the present invention as illustrated in the accompanying drawings.

BRIEF DESCRIPTION OF THE DRAWINGS

FIGS. 7a, 7b and 7c are explanatory views for explaining a process for producing the sixth actual example of the MOS transistor in accordance with the present invention; and FIG. 8 is a graphical view representing the electric current of the drain with respect to the gate voltage of the transistor of FIG. 7.

DESCRIPTION OF THE PREFERRED EMBODIMENTS

Embodiments of the single crystal silicon substrate in accordance with the present invention are described hereinafter with reference to the drawings.

FIGS. 1a to 1f represent in sequence a flow chart of a process for producing the substrate of the present invention using a quartz glass as an electric insulation material.

FIGS. 2a to 2g represent in sequence another flow chart of a process for producing the substrate of the present invention using a single crystal silicon wafer having an oxide film formed thereon as an electric insulation material.

Figure 1A:
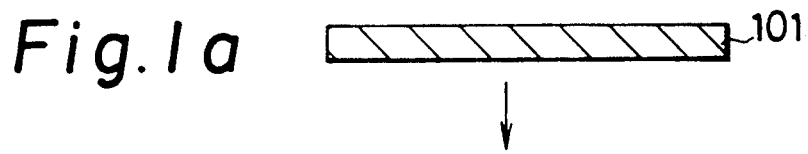
FIGS. 1a to 1f are explanatory views for explaining an example of the process for producing the quartz substrate in accordance with the present invention representing respective steps in sequence.

Referring to FIGS. 1, first, a mirror grinded quartz glass plate 101 is prepared, as illustrated in FIG. 1a. The thickness of the glass plate 101 is 0.5 to 2 mm, preferably 0.8 to 1.6 mm.

Figure 1B:
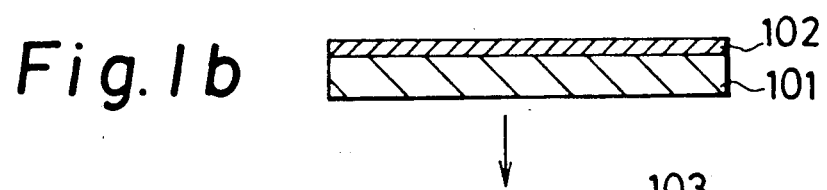

Second, a polycrystal silicon or an amorphous silicon film 102 is stacked on the glass plate 101 by an appropriate method such as a thermal CVD method, an ECR method, an optical CVD method, an LPCVD method or a plasma CVD method, using $SiH_4$, $Si_2H_6$, $SiF_4$ or $SiCl_4$, as illustrated in FIG. 1b. The thickness of the film 102 is 0.1 $\mu m$ to 1 $\mu m$, preferably 0.3 to 0.5 $\mu m$.

Figure 1C:
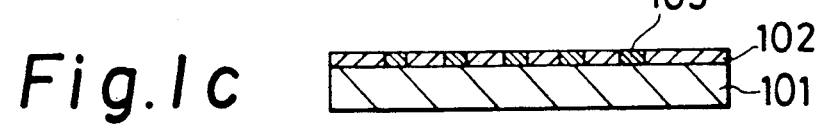

Third, impurities 103 are implanted into the film 102 at a regular interval to form rows of strips by an ion implantation method or a thermal diffusion method, as illustrated in FIG. 1c. The amount of the impurities 103 is $10^{18}$ to $10^{21}$ cm$^{-3}$, preferably $10^{20}$ to $10^{21}$ cm$^{-3}$. Impurities are selected from elements of group III to V in the periodic table, such as N, O, P, B, As, Sb or Ga.

Figure 1D:

After that, a surface protection layer 104 made from $SiO_2$ of 1.5 $\mu m$ thick is deposited on the substrate by a normal pressure CVD method, an optical CVD method, an ECR method, or an LPCVD method, using $SiH_4$, $Si_2H_6$, $SiF_4$, $SiCl_4$, $N_2O$, $O_2$, $NO_2$, $N_2O_4$, $N_2O_5$, CO, or $CO_2$, as illustrated in FIG. 1d.

Figure 1E:
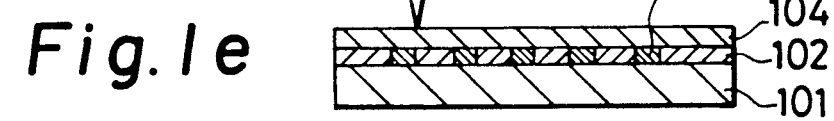

After that, a heat source 105 such as an infrared heater, a laser beam, a radio frequency heater, or a graphite heater is moved relative to the substrate to heat the implanted regions one after another in series, as illustrated in FIG. 1e. In this step, the impurity-implanted regions of the film 102 are molten and recrystallized (zone melt recrystallization).

Figure 1F:
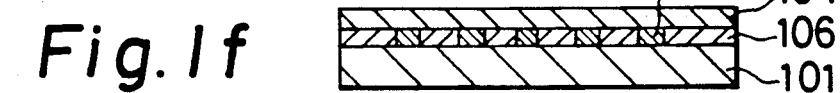

In accordance with the steps mentioned above, a substrate is obtained which substrate has a zone melt recrystallization film 106 which comprises strip shaped regions 107 of high density of impurities and partially formed grain boundaries, as illustrated in FIG. 1f. The film 106 has a surface crystal plane (100).

Figure 2A:
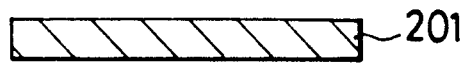
FIGS. 2a to 2g are explanatory views for explaining another example of the process for producing the single crystal silicon substrate in accordance with the present invention representing respective steps in sequence.

On the other hand, referring to FIG. 2, first, a mirror grinded wafer 201 of Si is prepared as illustrated in FIG. 2a. The thickness of the wafer 201 is 0.3 to 0.7 mm, preferably 0.4 to 0.6 mm. The wafer 201 has a crystal plane (100) or (111) on the surface thereof.

Figure 2B:
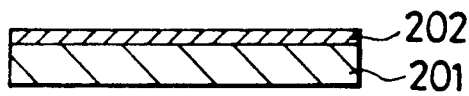

Second, a thermal oxide film 202 is formed on the wafer 201 by oxidizing the wafer 201 by a steam oxidation method or a dry oxidation method using $O_2$ gas, at a temperature of 900° to 1200° C., preferably 1000° to 1100° C., as illustrated in FIG. 2b. The thickness of the film 202 is 0.1 to 0.5 $\mu m$, preferably 0.2 to 0.3 $\mu m$.

Figure 2C:
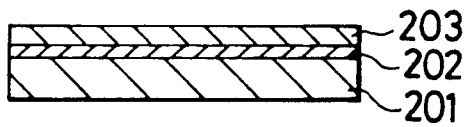
Figure 2D:
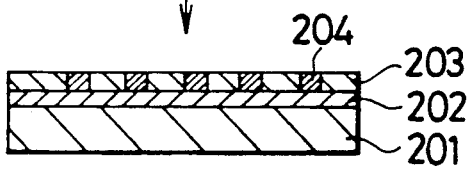
Figure 2E:
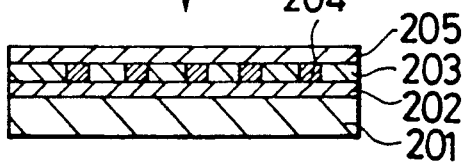
Figure 2F:
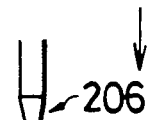
Figure 2F:
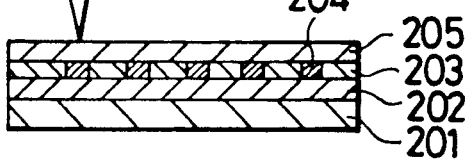
Figure 2G:
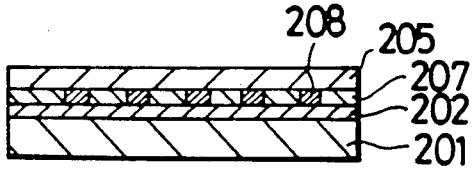

After that, the oxidized wafer 201 having the oxide film 202 formed thereon is treated in the same manner as the first embodiment of FIGS. 1b to 1f. That is, a polycrystal silicon or an amorphous silicon film 203 is formed on the oxide film 202 (FIG. 2c). Impurities 204 are implanted to form rows of strip shaped regions of high density of impurities in the film 203 at a regular interval (FIG. 2d). After that, a surface protection layer 205 of $SiO_2$ is formed (FIG. 2e). A zone melt recrystallization step is conducted by using a heat source 206 (FIG. 2f). Thus, a recrystallized single crystal silicon film 207 having strip shaped regions 208 of high impurity-density is formed (FIG. 2g).

In each of the first embodiment of FIG. 1 and the second embodiment of FIG. 2, it is desirable that the width of the impurity-implanted strip shaped region is narrower than that of the region of low density of impurities.

It is to be noted that the insulation member to support the single crystal silicon film may be made from a ceramic material such as $Al_2O_3$, AlN, $ZrO_2$, $Si_3N_4$, or SiC instead of the quartz glass 101 of the first embodiment or the Si wafer 201 of the second embodiment.

The zone melt recrystallization step of FIG. 1e or FIG. 2f is further described hereinafter wherein the heat source comprises a high-frequency heater.

Figure 3:
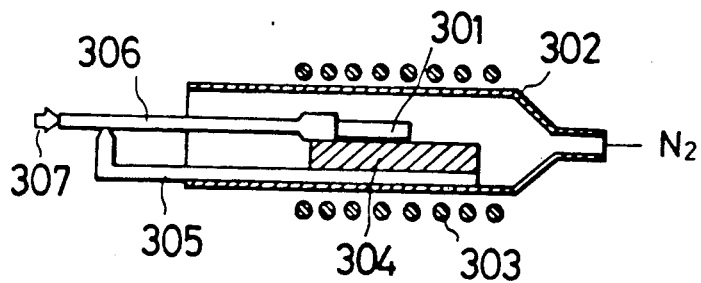
FIG. 3 is a constructional view of an example of the zone melt recrystallization device for producing the single crystal silicon substrate in accordance with the present invention.

FIG. 3 illustrates an example of the zone melt recrystallization device. Numeral 301 designates the substrate in the state of FIG. 1d or FIG. 2e. Numeral 302 designates a quartz pipe. Numeral 303 designates a work coil for applying a high frequency wave. Numeral 304 designates a carbon susceptor. Numeral 305 designates a support member made from quartz. Numeral 306 designates a rod made from quartz for moving the sample (substrate 301). Numeral 307 designates a driving direction of a reversible motor. It is to be noted that when the substrate of FIG. 1d is used as the substrate 301, the substrate is placed on the susceptor 304 in such a manner that the insulation member comes in contact with the susceptor 304. While when the substrate of FIG. 2e is used as the substrate 301, the substrate is placed on the susceptor 304 in such a manner that the insulation member is disposed in the opposite side to the susceptor 304.

Figure 4:
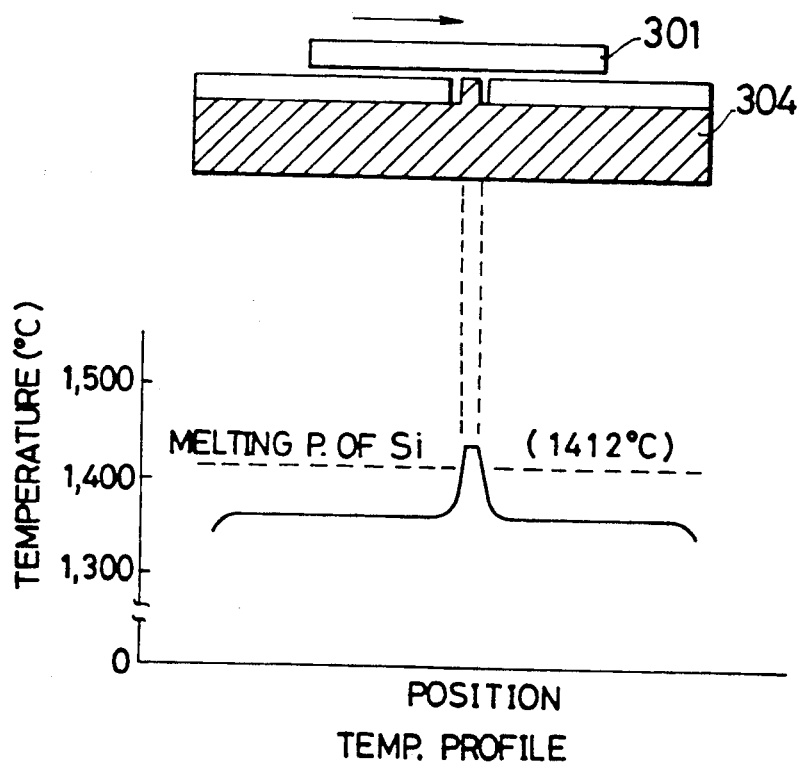
FIG. 4 is an explanatory view for explaining the temperature profile on the carbon susceptor of the device of FIG. 3.

FIG. 4 represents a temperature profile on the susceptor 304. As illustrated in FIG. 4, the susceptor temperature exceeds the melting point of silicon at one point or small region of the susceptor 304.

The substrate 301 is placed on the susceptor 304 having the temperature profile of FIG. 4 and scanned from the left to the right at a constant velocity as indicated by the arrow 307. During this scanning motion, the zone melt recrystallization step is conducted so that a single crystal thin film of silicon having a crystal plane (100) on the surface thereof is obtained.

The present invention is further described referring to actual data of examples of the substrate which were experimentally produced.

EXAMPLE 1

A first example of actually produced substrate is described with reference to FIGS. 5a and 5b.

The insulation member 401 comprises a quartz glass plate of 1 mm thick the surface of which is mirror grinded. A polycrystal silicon 402 is stacked on the glass plate 401 by an LPCVD method to form a layer of 0.35 μm thick. After that, oxygen atoms are implanted to the layer 402 to form strip shaped diffused regions 403 at a regular interval in the layer 402, each region having a 5 μm width, by an ion implantation method. The amount (density) of the implanted atoms is $10^{17}$ to $10^{21}$ cm$^{-3}$. The width of the region 404 between every adjacent two diffused regions 403 is 50 μm. A surface protection film 405 of SiO$_2$ is deposited on the layer 402 by an LPCVD method to form a layer of 1.5 μm thick.

The substrate mentioned above is then treated by the device of FIG. 3 on the condition that the input power is 9.7 KW and the scanning speed is 0.1 mm/sec to conduct the zone melt recrystallization process.

Figure 5:
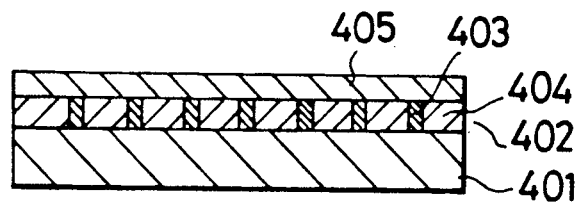
FIGS. 5a and 5b are explanatory views for explaining a process for producing the first, second, third and seventh actual examples of the substrate in accordance with the present invention.
Figure 5:
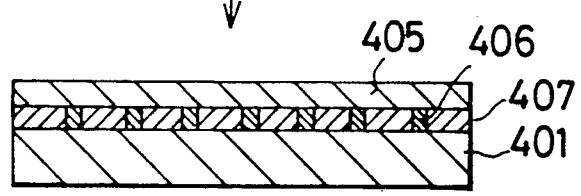

FIG. 5b illustrates the substrate in the state after the zone mele recrystallization treatment.

With respect to the polycrystal silicon film 402, the film is deposited under the condition that SiH$_4$ gas and N$_2$ gas (carrier gas) are used at a flow rate ratio of 1/10 and that the substrate temperature is 650° C.

With respect to the surface protection film 405, the film is deposited under the condition that SiH$_4$ gas and N$_2$O gas are used at a flow rate ration of 1/50 and that the substrate temperature is 750° C.

Table 1 represents the evaluation of the characteristic of the region 403 in relation to the density of oxygen atom. The evaluation items are the orientation of the crystal plane of the region 407, the ratio of the grain boundary number included in the region 406 in comparison to that included in the region 407 and the surface roughness (Ra) of the region 407. With respect to the surface roughness Ra, mark ○ represents the state Ra<200 Å, mark Δ represents the state 200 Å<Ra, and mark × represents the state Ra>1000 Å.

As can be seen from the table 1, a good result is obtained when the oxygen atom density in the region 403 is $10^{20}$ to $10^{21}$ cm$^{-3}$. The grain boundary ratio of the region 406 is reduced when the oxygen atom density is lowered. This is because the freezing point effect is not obtained due to the shortage of the oxygen atoms.

TABLE 1

| OXYGN DEN. | PLN ORNT. | SRF ROUGH. | GRN BNDRY |
|---|---|---|---|
| $10^{17}$ cm$^{-3}$ | (100) | X | 50% |
| $10^{18}$ | (100) | Δ | 60 |
| $10^{19}$ | (100) | ○ | 80 |
| $10^{20}$ | (100) | ○ | 100 |
| $10^{21}$ | (100) | ○ | 100 |

EXAMPLE 2

A second example of the substrate in accordance with the present invention is described hereinafter with reference again to FIGS. 5a and 5b.

The insulation member 401 comprises a quartz plate which is mirror grinded and has a thickness of 1.5 mm. An amorphous silicon 402 is deposited on the plate 401 to form a film of 0.5 μm thick thereon. Nitrogen atoms are implanted into the film 402 to form strip shaped ion diffused regions 403 at a regular interval by an ion implantation method. The amount of the atoms is $10^{17}$ to $10^{21}$ cm$^{-3}$. The width of each strip shaped region 403 is 5 μm. The width of the region 404 formed between every two adjacent diffusion regions 403 is 50 μm. A surface protection layer 405 of SiO$_2$ is deposited on the film 402 to form a film of 1.5 μm thick thereon by an LPCVD method.

The substrate treated as mentioned above is then subjected to the zone melt recrystallization process using a graphite heater under the condition that the input power is 10.3 KW and that the scanning speed is 1 mm/sec.

FIG. 5b represents the substrate in the state after the treatment of zone melt recrystallization process.

The amorphous film 402 is deposited by a plasma CVD method using SiH$_4$ gas and H$_2$ gas (as a carrier gas) under the condition that the flow rate ratio of SiH$_4$ and H$_2$ is 1/10 and that the substrate temperature is 350° C.

The surface protection film 405 is deposited by an LPCVD method using SiH$_4$ gas and O$_2$ gas under the condition that the flow rate ratio of SiH$_4$ and O$_2$ is 1/50 and that the substrate temperature is 450° C.

Table 2 represents the evaluation of the characteristic of the region 403 of the substrate in relation to the density of nitrogen atoms implanted to the region 403 with respect to the same items as in the case of example 1 mentioned before.

As can be seen from the table 2, a good result is obtained when the nitrogen atom density in the region 403 is $10^{20}$ to $10^{21}$ cm$^{-3}$. The grain boundary ratio of the region 406 is reduced when the nitrogen atom density is lowered. This is because the freezing point effect is not obtained due to the shortage of the nitrogen atoms.

TABLE 2

| NTRGN DEN. | PLN ORNT. | SRF ROUGH. | GRN BNDRY |
|---|---|---|---|
| $10^{17}$ cm$^{-3}$ | (100) | X | 40% |
| $10^{18}$ | (100) | Δ | 50 |
| $10^{19}$ | (100) | Δ | 70 |
| $10^{20}$ | (100) | ○ | 100 |
| $10^{21}$ | (100) | ○ | 100 |

EXAMPLE 3

A third example of the substrate in accordance with the present invention is described hereinafter with reference again to FIGS. 5a and 5b.

The insulation member 401 comprises a quartz plate which is mirror grinded and has a thickness of 0.8 mm. A polycrystal silicon 402 is deposited on the plate 401 to form a film of 0.5 μm thick thereon by an LPCVD method. P (phosphorus) atoms are implanted into the film 402 to form strip shaped ion diffused regions 403 at a regular interval by an ion implantation method. The amount of the atoms is $10^{21}$ cm$^{-3}$. The width of each strip shaped region 403 is 2 to 10 μm. The width of the region 404 formed between every two adjacent diffusion regions 403 is 2 to 100 μm. A surface protection layer 405 of SiO$_2$ is deposited on the film 402 to form a film of 1.5 μm thick thereon by a normal pressure CVD method.

The substrate treated as mentioned above is then subjected to the zone melt recrystallization process using the device of FIG. 3 under the condition that the input power is 9.7 KW and that the scanning speed is 0.1 mm/sec.

FIG. 5b represents the substrate in the state after the treatment of zone melt recrystallization process.

The polycrystal silicon film 402 is deposited by an LPCVD method using SiH$_4$ gas and H$_2$ gas (as a carrier gas) under the condition that the flow rate ratio of SiH$_4$ and H$_2$ is 1/10 and that the substrate temperature is 650° C.

The surface protection film 405 is deposited by a normal pressure CVD method using SiH$_4$ gas and O$_2$ gas under the condition that the flow rate ratio of SiH$_4$ and O$_2$ is 1/250 and that the substrate temperature is 400° C.

Within the film recrystallized from the film 402 (FIG. 5a), there are formed a high density region 406 (FIG. 5b) which corresponds to the region 403 and has a P atom density of $10^{19}$ cm$^{-3}$ and a low density region 407 which corresponds to the region 404 and has a P atom density of $10^{15}$ cm$^{-3}$.

Table 3 represents the evaluation of the characteristic of the substrate in relation to the width of each of the regions 403 and 404 with respect to the same items as in the case of example 1 mentioned before.

As can be seen from the table 3, the grain boundary ratio of the region 406 is reduced when the width of the region 406 having P atom density $10^{19}$ cm$^{-3}$ is narrower than that of the region 407 having P atom density $10^{15}$ cm$^{-3}$ since a sufficient freezing point effect is not obtained.

TABLE 3

| WIDTH OF 404 (μm) | WIDTH OF 403 (μm) | PLANE ORTN. | SURF ROUGH. | GRAIN BNDRY RATIO (%) |
|---|---|---|---|---|
| 2 | 100 | (100) | X | 8 |
| 5 | 90 | (100) | X | 10 |
| 10 | 70 | (100) | X | 16 |
| 30 | 50 | (100) | △ | 50 |
| 50 | 30 | (100) | ◯ | 100 |
| 70 | 15 | (100) | ◯ | 100 |
| 90 | 5 | (100) | ◯ | 100 |
| 100 | 2 | (100) | ◯ | 100 |

EXAMPLE 4

Figure 6:
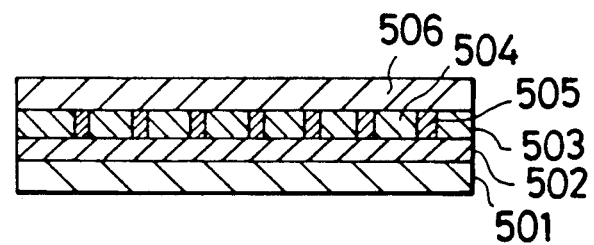
FIGS. 6a and 6b are explanatory views for explaining a process for producing the fourth actual example of the present invention.
Figure 6:
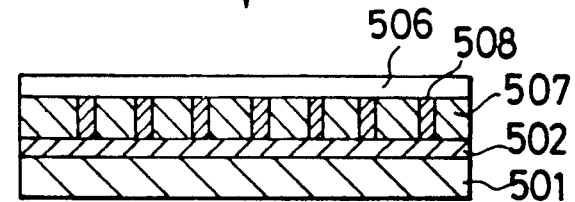

A fourth example of the actually produced substrate in accordance with the present invention is described hereinafter with reference to FIGS. 6a and 6b.

The support member 501 comprises a P type silicon wafer which is mirror grinded and has a thickness of 0.5 mm. The silicon wafer 501 is heated to a temperature of 1000° C. in an atmosphere of oxygen gas to form an oxide film 502 of SiO$_2$ having a thickness of 0.2 μm on the wafer 501. A polycrystal silicon 503 is deposited on the film 502 by an LPCVD method to form a film of 0.4 μm thick. Boron (B) atoms are implanted into the film 503 to form strip shaped diffusion regions 505 at a regular interval by an ion implantation method. The density of B atoms implanted is $10^{17}$ to $10^{21}$ cm$^{-3}$. The width of the strip shaped region 505 is 5 μm. The width of the region 504 between every two adjacent regions 505 is 50 μm. A surface protection layer 506 of SiO$_2$ is deposited on the film 503 to form a film of 1.5 μm thick thereon by an LPCVD method.

The substrate treated as mentioned above is then subjected to the zone melt recrystallization process using an Ar laser under the condition that the input power is 15 W, the scanning speed is 10 cm/sec and that the temperature of the substrate is 450° C.

The polycrystal silicon layer 503 is deposited by an LPCVD method using SiH$_4$ gas and N$_2$ gas under the condition that the gas flow rate ratio of SiH$_4$ and N$_2$ is 1/10 and that the temperature of the substrate is 650° C.

The surface protection layer 506 is deposited by an LPCVD method using SiH$_4$ gas and N$_2$O gas under the condition that the gas flow rate ratio of SiH$_4$ and N$_2$O is 1/50 and that the temperature of the substrate is 750° C.

Table 4 represents the evaluation of the characteristic of the layer 505 of the substrate in relation to the doping amount (density) of boron atoms. The evaluation items are (1) the plane orientation of the crystal surface in the region 507, (2) ratio of the number of grain boundaries generated in the region 508 with respect to that of the region 507, (3) the surface roughness of the layer and (4) the conductivity of the region 507.

As can be seen from the table, a preferable characteristic can be obtained when the B atom doping density in the region 505 is $10^{20}$ to $10^{21}$ cm$^{-3}$ wherein the grain boundaries are concentrated to generate in the region 508.

Since B atom forms the acceptor level, the region 507 bears P type semiconductor characteristics due to the diffusion of B atoms from the regions 505 in the both sides thereof after the recrystallization process. Also, the conductivity of the region 507 increases when the doping amount of the B atoms in the regions 505 is increased so that the diffusion of the atoms is enhanced.

Accordingly, it becomes possible to shorten the time of manufacturing process of MOS transistors and upgrade the characteristic thereof by using the region 507 as the active region of the transistor and the region 508 as the source/drain regions thereof.

TABLE 4

| B ATOM IN 505 (cm$^{-3}$) | PLN ORNTN | SUFC ROUGH. | GRN BND. OF 508 (%) | CNDCTIVITY OF 507 (S) |
|---|---|---|---|---|
| $10^{17}$ | (100) | X | 40 | 0.003 |
| $10^{18}$ | (100) | △ | 60 | 0.02 |
| $10^{19}$ | (100) | △ | 80 | 0.5 |
| $10^{20}$ | (100) | ◯ | 100 | 3 |
| $10^{21}$ | (100) | ◯ | 100 | 10 |

EXAMPLE 5

A fifth example of the actually produced substrate in accordance with the present invention is described hereinafter with reference again to FIGS. 6a and 6b.

The support member 501 comprises a P type silicon wafer which is mirror grinded and has a thickness of 0.5 mm. The silicon wafer 501 is heated to temperature of 1000° C. in an atmosphere of oxygen gas to form an oxide film 502 of SiO$_2$ having a thickness of 0.5 μm on the wafer 501. A polycrystal silicon 503 is deposited on the film 502 by an LPCVD method to form a film of 0.5 μm thick. Phosphorus (P) atoms are implanted into the film 503 to form strip shaped diffusion regions 505 at a regular interval by an ion implantation method. The density of P atoms implanted is $10^{17}$ to $10^{21}$ cm$^{-3}$. The width of the strip shaped region 505 is 5 μm. The width of the region 504 between every two adjacent regions 505 is 50 μm. A surface protection layer 506 of SiO$_2$ is deposited on the film 503 to form a film of 1.5 μm thick thereon by an LPCVD method.

The substrate treated as mentioned above is then subjected to the zone melt recrystallization process using an Ar laser under the condition that the input power is 15 W, the scanning speed is 10 cm/sec and that the temperature of the substrate is 450° C.

The polycrystal silicon layer 503 is deposited by an LPCVD method using SiH₄ gas and N₂ gas under the condition that the gas flow rate ratio of SiH₄ and N₂ is 1/10 and that the temperature of the substrate is 650° C.

The surface protection layer 506 is deposited by an LPCVD method using SiH₄ gas and N₂O gas under the condition that the gas flow rate ratio of SiH₄ and N₂O is 1/50 and that the temperature of the substrate is 750° C.

Table 5 represents the evaluation of the characteristic of the layer 505 of the substrate in relation to the doping amount (density) of P atoms. The evaluation items are (1) the plane orientation of the crystal surface in the region 507, (2) ratio of the number of grain boundaries generated in the region 508 with respect to that of the region 507, (3) the surface roughness of the layer and (4) the conductivity of the region 507.

As can be seen from the table, a preferable characteristic can be obtained when the P atom doping density in the region 505 is $10^{20}$ to $10^{21}$ cm$^{-3}$ wherein the grain boundaries are concentrated to generate in the region 508.

Since P atom forms the donor level, the region 507 bears N type semiconductor characteristics due to the diffusion of P atoms from the regions 505 in the both sides thereof after the recrystallization process. Also, the conductivity of the region 507 increases when the doping amount of the P atoms in the regions 505 is increased so that the diffusion of the atoms is enhanced.

Accordingly, it becomes possible to shorten the time of manufacturing process of MOS transistors and upgrade the characteristic thereof by using the region 507 as the active region of the transistor and the region 508 as the source/drain regions thereof.

TABLE 5

| P ATOM IN 505 (cm$^{-3}$) | PLN ORNTN | SUFC ROUGH. | GRN BND. OF 508 (%) | CNDCTIVITY OF 507 (S) |
|---|---|---|---|---|
| $10^{17}$ | (100) | X | 50 | 0.003 |
| $10^{18}$ | (100) | Δ | 60 | 0.08 |
| $10^{19}$ | (100) | Δ | 80 | 0.3 |
| $10^{20}$ | (100) | ○ | 100 | 4 |
| $10^{21}$ | (100) | ○ | 100 | 18 |

EXAMPLE 6

A sixth example of the actually produced substrate in accordance with the present invention is described hereinafter with reference to FIGS. 7a, 7b and 7c.

FIGS. 7 are explanatory sectional views of a MOS transistor using the substrate of the fifth example 5 mentioned before for explaining the structure thereof.

FIG. 7a represents the single crystal silicon substrate of the example 5. The substrate comprises a P-type silicon wafer 501, an oxide film 502 of 0.5 μm thick, a surface protection layer 506 of SiO₂ having a thickness of 1.5 μm, n-type single crystal regions 507 which are formed at a regular interval and contain no grain boundaries and each of which regions 507 has a strip shape of 50 μm wide and a conductivity of 0.3 s, and n-type single crystal regions 508 which are formed at a regular interval and contain grain boundaries therein and each of which regions 508 has a strip shape of 10 μm wide and a conductivity of 130 s.

FIG. 7b is a constructional view of a MOS transistor using the substrate of FIG. 7a.

FIG. 7c is an enlarged view of the transistor of FIG. 7b.

The transistor comprises an SiO₂ region 601 which is subjected to an element separation treatment by a LOCOS method, a thermal oxidation gate film 602 having a thickness of 1000 Å, a polycrystal silicon gate electrode 603 of 5000 Å thick deposited by an LPCVD method, aluminum electrodes 604 of 1.5 μm thick, a source region 508 as explained in FIG. 7a, and a drain region 509 as explained also in FIG. 7a.

FIG. 8 is a graphical view of drain current (Id) in relation to gate voltage (Vg) on the condition that a bias voltage $V_{DS}=0.1$ V is applied between the source and the drain of the transistor. The drain current is represented in a logarithmic scale. The gate length of the transistor is 50 μm and the gate width thereof is 100 μm.

It can be seen from FIG. 8 that the transistor functions in an enhancement mode and the electron mobility μm is 764/cm, which guarantees an adequate characteristic as the bulk single crystal silicon.

EXAMPLE 7

A seventh example of the actually produced substrate in accordance with the present invention is described hereinafter with reference again to FIGS. 5a and 5b.

The insulation member 401 comprises an Al₂O₃ plate which is mirror grinded and has a thickness of 1 mm. A polycrystal silicon 402 is deposited on the plate 401 by an LPCVD method to form a film of 0.5 μm thick. Phosphorus (P) atoms are implanted into the film 402 to form strip shaped diffusion regions 403 at a regular interval by an ion implantation method. The density of P atoms implanted is $10^{17}$ to $10^{21}$ cm$^{-3}$. The width of the region 404 between every two adjacent regions 403 is 50 μm. A surface protection layer 405 of SiO₂ is deposited on the film 402 to form a film of 1.5 μm thick thereon by an LPCVD method.

The substrate treated as mentioned above is then subjected to the zone melt recrystallization process using the device of FIG. 3 under the condition that the input power is 9.7 KW and that the scanning speed is 0.1 mm/sec.

FIG. 5b illustrates the substrate in the state after the treatment of zone melt recrystallization process.

The polycrystal silicon layer 402 is deposited by an LPCVD method using SiH₄ gas and N₂ gas under the condition that the gas flow rate ratio of SiH₄ and N₂ is 1/10 and that the temperature of the substrate is 650° C.

The surface protection layer 405 is deposited by an LPCVD method using SiH₄ gas and N₂O gas under the condition that the gas flow rate ratio of SiH₄ and N₂O is 1/50 and that the temperature of the substrate is 750° C.

Table 6 represents the evaluation of the characteristic of the layer 403 of the substrate in relation to the doping amount (density) of P atoms. The evaluation items are (1) the plane orientation of the crystal surface in the region 407, (2) ratio of the number of grain boundaries generated in the region 406 with respect to that of the region 407, and (3) the surface roughness of the layer.

As can be seen from the table, a preferable characteristic can be obtained when the P atom doping density in the region 403 is $10^{20}$ to $10^{21}$ cm$^{-3}$ wherein the grain boundaries are concentrated to generate in the region 406.

The ratio of the grain boundaries formed in the region 406 is decreased when the P atom density in the region 403 is decreased. This is because the freezing point depression effect is not obtained due to the shortage of the P atoms.

TABLE 6

| P ATOM DENSITY $(cm^{-3})$ | PLN ORNTN | SUFC ROUGH | RATIO OF GRN BND. (%) |
|---|---|---|---|
| $10^{17}$ | (100) | X | 50 |
| $10^{18}$ | (100) | △ | 60 |
| $10^{19}$ | (100) | ○ | 80 |
| $10^{20}$ | (100) | ○○○ | 100 |
| $10^{21}$ | (100) | ○○ | 100 |

Many widely different embodiments of the present invention may be constructed without departing from the spirit and scope of the present invention. It should be understood that the present invention is not limited to the specific embodiments described in the specification, except as defined in the appended claims.

What is claimed is:

1. A silicon substrate, comprising:
   an electrically insulating member; and
   a silicon film formed on said insulating member, said silicon film comprising:
   first strip shape regions arranged to be parallel to each other, each of said first strip shape regions having a high density of inorganic impurities implanted thereinto; and
   second strip shape regions alternately arranged with said first strip shape regions one by one, each of said second strip shape regions having a low density of said impurities; and
   grain boundaries generated in said silicon film being concentrated in said first strip shape regions.

2. A silicon substrate according to claim 1, wherein said impurities are composed of one of the elements of groups III to V of the periodic table.

3. A silicon substrate according to claim 1, wherein said insulating member comprises one material selected from the group consisting of quartz glass, silicon wafer, $Al_2O_3$, AlN, $ZrO_2$, $Si_3N_4$, and SiC.

4. A silicon substrate according to claim 1, wherein an oxide film is interposed between said insulating member and said silicon film.

5. A silicon substrate according to claim 1, wherein each of said first regions has a width which is narrower than that of said second regions.

* * * * *